United States Patent
Magnee et al.

(10) Patent No.: US 7,794,540 B2
(45) Date of Patent: Sep. 14, 2010

(54) METHOD OF MANUFACTURING A SEMICONDUCTOR DEVICE

(75) Inventors: Petrus Hubertus Cornelis Magnee, Leuven (BE); Johannes Josephus Theodorus Marinus Donkers, Eindhoven (NL); Xiaoping Shi, Heverlee (BE)

(73) Assignee: NXP B.V., Eindhoven (NL)

( * ) Notice: Subject to any disclaimer, the term of this patent is extended or adjusted under 35 U.S.C. 154(b) by 1073 days.

(21) Appl. No.: 10/539,549

(22) PCT Filed: Dec. 16, 2003

(86) PCT No.: PCT/IB03/06017

§ 371 (c)(1),
(2), (4) Date: Jun. 16, 2005

(87) PCT Pub. No.: WO2004/057654

PCT Pub. Date: Jul. 8, 2004

(65) Prior Publication Data

US 2006/0148257 A1   Jul. 6, 2006

(30) Foreign Application Priority Data

Dec. 20, 2002  (EP) .................... 02080509

(51) Int. Cl.
*C30B 25/00* (2006.01)
*C30B 28/12* (2006.01)
*H01L 21/00* (2006.01)
*H01L 27/06* (2006.01)

(52) U.S. Cl. .......... 117/84; 117/89; 117/105; 117/106; 438/96; 438/97; 438/400; 438/478; 438/751

(58) Field of Classification Search ............ 117/84, 117/89, 105–106; 438/96, 97, 400, 478, 438/743–757
See application file for complete search history.

(56) References Cited

U.S. PATENT DOCUMENTS

| | | | | |
|---|---|---|---|---|
| 5,110,757 A * | 5/1992 | Arst et al. | ............ | 438/489 |
| 5,250,448 A * | 10/1993 | Hamasaki et al. | ............ | 438/312 |
| 5,310,698 A * | 5/1994 | Wild | ............ | 438/658 |
| 5,491,107 A * | 2/1996 | Turner et al. | ............ | 438/486 |
| 5,523,606 A * | 6/1996 | Yamazaki | ............ | 257/370 |
| 5,604,374 A * | 2/1997 | Inou et al. | ............ | 257/593 |
| 5,942,286 A * | 8/1999 | Ohno et al. | ............ | 427/352 |
| 6,048,781 A * | 4/2000 | Turner et al. | ............ | 438/486 |
| 6,344,673 B1 * | 2/2002 | Aussilhou et al. | ............ | 257/301 |
| 6,586,297 B1 * | 7/2003 | U'Ren et al. | ............ | 438/235 |
| 6,821,825 B2 * | 11/2004 | Todd et al. | ............ | 438/150 |
| 2004/0195633 A1 * | 10/2004 | Chakravarthi et al. | ............ | 257/369 |

FOREIGN PATENT DOCUMENTS

WO    WO 00/17423    3/2000

* cited by examiner

*Primary Examiner*—Michael Kornakov
*Assistant Examiner*—G. Nagesh Rao

(57) ABSTRACT

Method of manufacturing a semiconductor device, in which on a region of silicon oxide (5) situated next to a region of monocrystalline silicon (4) at the surface (3) of a semiconductor body (1), a non-monocrystalline auxiliary layer (8) is formed. The auxiliary layer is formed in two steps. In the first step, the silicon body is heated in an atmosphere comprising a gaseous arsenic compound; in the second step it is heated in an atmosphere comprising a gaseous silicon compound instead of said arsenic compound. Thus, the regions of silicon oxide are provided with an amorphous or polycrystalline silicon seed layer in a self-aligned manner.

10 Claims, 2 Drawing Sheets

METHOD OF MANUFACTURING A SEMICONDUCTOR DEVICE

Figure 1:
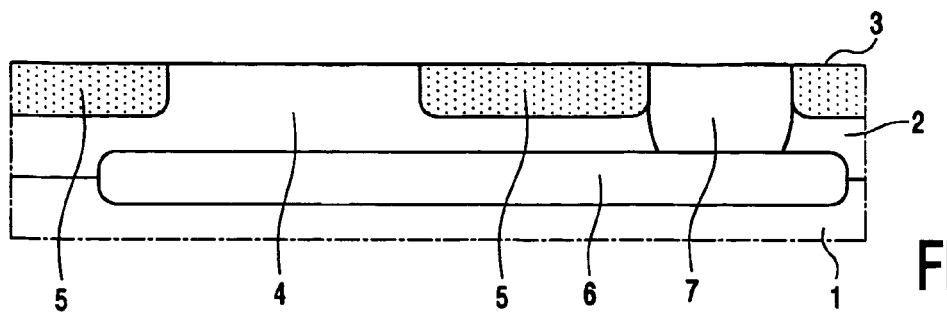

The invention relates to a method of manufacturing a semiconductor device, in which on a region of silicon oxide situated next to a region of monocrystalline silicon at a surface of a semiconductor body, a non-monocrystalline auxiliary layer is formed.

Said region of silicon oxide may in this case be, for example, a layer of silicon oxide situated on the semiconductor body or a silicon oxide region, such as a field insulation region, recessed in the semiconductor body.

The auxiliary layer is useful, in particular, in processes where a silicon-containing layer is deposited and where it is desirable that this layer grows as a monocrystalline layer on the region of monocrystalline silicon, and as an amorphous or polycrystalline layer on the region of silicon oxide. Said auxiliary layer enhances the growth of the silicon-containing layer on the region of silicon oxide, as a result of which the deposition process can be carried out at such a low temperature that it is precluded that in the course of this deposition process, atoms of dopants provided in the active regions move as a result of diffusion. This is important, in particular, for the manufacture of semiconductor devices with extremely small transistors.

The silicon-containing layer may be a layer that contains only silicon, but it may also be a layer that, in addition to silicon, contains germanium. Said silicon-containing layer may also comprise sub-layers which are deposited one on top of the other, one sub-layer comprising, for example, only silicon and the other sub-layer comprising, in addition to silicon, germanium. Moreover, the layer or one or more of the sub-layers may be doped with atoms of a customary dopant.

In the monocrystalline silicon-containing layer formed on the region of monocrystalline silicon, for example, the base of a bipolar transistor may be formed, which base can be electrically contacted by the adjoining amorphous or polycrystalline layer formed on the regions of silicon oxide.

WO 00/17423 describes a method of the type mentioned in the opening paragraph wherein a layer of silicon nitride is used as the auxiliary layer. Said auxiliary layer is provided by covering the entire surface of the silicon body, on which border regions of monocrystalline silicon, here active semiconductor regions, and regions of silicon oxide, here field insulation regions, with a layer of silicon nitride, after which a photoresist mask is provided having windows within which the active regions are not covered, and by subsequently etching away the parts of the silicon nitride layer that are not covered by the photoresist mask. Next, a layer of silicon is deposited on the surface, which silicon layer grows as a monocrystalline layer on the region of monocrystalline silicon, and as a polycrystalline layer on the region of silicon oxide.

In order to use the surface of the silicon body as efficiently as possible, it is desirable to completely etch away the silicon nitride auxiliary layer from the active regions; otherwise these regions would not be covered throughout their surface area with a monocrystalline layer. When the photoresist mask is provided, aligning tolerances must be taken into account, so that the photoresist mask must be provided with windows that are larger than the active regions. As a result, an edge of the field insulation regions which borders directly on the active regions is not covered either by the photoresist mask and hence the auxiliary layer is also removed from this edge. During the deposition of the silicon layer, the growth at the location of this edge will lag, in this prior-art method, as a result of which a thinner or even interrupted layer of monocrystalline material may be formed at the location of this edge. Prior to the deposition of this layer of silicon, a HF etch step will be carried out in practice to clean the surface of the active region. Due to this etch step, also said uncovered edge of the field insulation regions will be etched, as a result of which a groove is formed at said location. This groove too adversely affects the connection between the monocrystalline layer and the non-monocrystalline layer. At the location of the edge, an undesirable, poor electric contact can thus develop between the monocrystalline layer and the non-monocrystalline layer.

It is an object of the invention to obviate these problems. For this purpose, the method in accordance with the invention is characterized in that the auxiliary layer is formed in two process steps, in which, in the course of the first process step, a layer of arsenic is formed on the region of monocrystalline silicon by heating the semiconductor body in an atmosphere with an arsenic compound, and, in the course of the second process step, a layer of non-monocrystalline silicon is formed as an auxiliary layer on the region of silicon oxide by heating the semiconductor body in an atmosphere comprising a gaseous silicon compound instead of a gaseous arsenic compound.

During the first step, wherein a layer of arsenic is formed on the region of monocrystalline silicon by heating the semiconductor body in an atmosphere with an arsenic compound, no arsenic is deposited on the region of silicon oxide. The process stops automatically when a closed monoatomic layer of arsenic has formed on the region of monocrystalline silicon. During the second step, in which a layer of non-monocrystalline silicon is formed as an auxiliary layer on the region of silicon oxide by heating the semiconductor body in an atmosphere without gaseous arsenic compound but with a gaseous silicon compound, the deposition of an amorphous or polycrystalline layer of silicon on the region of silicon oxide starts immediately, while during a certain nucleation time, no deposition takes place on the arsenic-covered region of monocrystalline silicon. An auxiliary layer of amorphous or polycrystalline silicon can thus be formed in a self-aligning manner, which completely covers the silicon oxide region and leaves the monocrystalline silicon region completely exposed. If a silicon-containing layer is subsequently deposited on a surface thus prepared, then growth starts immediately on the monocrystalline silicon region as well as on the silicon oxide region. The monocrystalline and non-monocrystalline layers then deposited blend seamlessly.

A simple method is obtained if during the formation of the auxiliary layer, the semiconductor body is heated during the first process step in an atmosphere comprising, in addition to the gaseous arsenic compound, the gaseous silicon compound used during the second process step. In this case, after the first step only the supply of gaseous arsenic compound has to be stopped. Surprisingly, it has been found that this silicon compound does not influence the formation of the layer of arsenic.

Preferably, during the formation of the auxiliary layer, the second process step is ended before deposition from the silicon compound takes place on the arsenic layer formed on the regions of monocrystalline silicon. In this case, the deposition process of the auxiliary layer is stopped before the nucleation time has ended. After this nucleation time, a layer starts forming also on the regions of monocrystalline silicon. These must be etched away since they would hamper the growth of monocrystalline silicon. It is simpler to stop the deposition process in time, i.e. within said nucleation time.

If, during the formation of the auxiliary layer the semiconductor body is heated during both process steps at a temperature in the range between 400 and 600° C. in an atmosphere with a pressure below 500 mTorr, then the above-mentioned nucleation time is more than approximately 5 minutes, during which period of time an approximately 10 nm thick auxiliary layer of low-amorphous silicon can be formed.

After the formation of the auxiliary layer, the monoatomic layer of arsenic can be removed before a silicon-containing layer is deposited. Surprisingly, it has been found, however, that by heating the semiconductor body in an atmosphere with a silicon compound, a silicon-containing layer can be deposited on the layer of arsenic and the adjacent auxiliary layer of non-monocrystalline silicon without the growth of such a layer being adversely affected by the presence of the layer of arsenic. It has also been found that a layer of $Si_{1-x}Ge_x$, where $0.05<x<0.20$ and to which less than 0.2 at. % carbon has been added, can be directly deposited on the layer of arsenic and the adjoining auxiliary layer by heating the semiconductor body in an atmosphere with a silicon compound and a germanium compound.

If, for the manufacture of the auxiliary layer, an n-type semiconductor zone is formed in the region of monocrystalline silicon, then the arsenic layer is formed on the n-type semiconductor zone. As a result, a semiconductor zone is formed having a relatively heavily doped surface. This is advantageous, in particular, if an n-type collector zone of a bipolar transistor is formed in the regions of monocrystalline silicon and, in the monocrystalline layer deposited thereon, a p-type base zone of this transistor is formed. In absolute terms, the p-type base zone is more heavily doped than the n-type collector zone formed in the active regions. By virtue of the presence of the arsenic layer at the surface of the collector zone it is achieved that the pn-junction will be situated between collector and base in the deposited monocrystalline layer. Without said arsenic layer, this pn-junction would be formed below the deposited monocrystalline layer in the collector zone, as a result of which a thicker base and hence a slower transistor would be formed.

These and other aspects of the invention are apparent from and will be elucidated with reference to the embodiment(s) described hereinafter.

In the drawings:

FIGS. 1 through 8 are diagrammatic, cross-sectional views of a few stages of the manufacture of a semiconductor device with a bipolar transistor that is manufactured by means of the device in accordance with the invention.

FIGS. 1 through 8 are diagrammatic, cross-sectional views of several stages in the manufacture of a semiconductor device with a bipolar npn-transistor. For simplicity, the Figures merely show the manufacture of a single transistor. It will be understood that, in practice, a semiconductor device with an integrated circuit may comprise very many such transistors as well as transistors of different types.

A semiconductor body of silicon 1 is taken as a basis, which as shown in FIG. 1 is provided with an epitaxially grown layer 2 that is n-type doped with approximately $5.10^{15}$ atoms per cc. A region of monocrystalline silicon, here an active region 4, and silicon oxide regions, here field insulation regions 5, bordering on said active region 4 are formed in said layer 2 so as to border on a surface 3 thereof. Furthermore, a buried layer 6 that is n-type doped with approximately $10^{20}$ atoms per cc and a contact zone 7 bordering on the surface 3 and n-type doped with approximately $10^{19}$ atoms per cc are formed in a customary manner. In the active region 4 there is further provided a deep n-type doping with approximately $10^{18}$ atoms per cc (not shown). This reaches as far as the buried layer 6 but leaves the doping of the epitaxially formed layer 2 unchanged near the surface 3. This doping serves to improve the contacting to the transistor's collector to be formed near the surface 3.

As will be described hereinbelow, a silicon-containing layer will be deposited on the surface 3, which silicon-containing layer grows in a monocrystalline manner on the monocrystalline active region 4 and in a non-monocrystalline (amorphous or polycrystalline) manner on the insulation regions 5. In addition to silicon, this layer may also comprise germanium. This layer may further comprise sub-layers deposited one on top of the other, in which case, for example, one sub-layer comprises only silicon and the other sub-layer comprises silicon and germanium.

Prior to the deposition process, an auxiliary layer 8 is formed on the insulation regions to enhance the growth of the silicon-containing layer there. By virtue of said auxiliary layer 8, the deposition process can be carried out at a comparatively low temperature below 700° C. It is thus precluded that atoms of dopants provided in the active regions migrate as a result of diffusion, as would occur, for example, in the case of the n-type doping provided in the active region 4 to improve the contacting to the collector zone to be formed.

The auxiliary layer 8 is formed in two steps by means of a customary LPCVD process at a temperature between 400 and 600° C. and a pressure below 700 mTorr, in this example a temperature of 550° C. and a pressure of 600 mTorr. During the first process step, the semiconductor body 1 is heated in an atmosphere comprising a gaseous arsenic compound and, in this example, also a gaseous silicon compound, and during the second step it is heated in an atmosphere without gaseous arsenic compound but with the same gaseous silicon compound as during the first step. In this example, the slice 1 is placed in a reaction chamber through which, during the first step, a gas mixture is passed for three minutes which, as well as a non-reactive carrier gas such as nitrogen, comprises arsine and silane, and during the second step, a gas mixture comprising, in addition to a non-reactive carrier gas, only silane is passed through said reaction chamber for approximately 10 minutes.

During the first step, the gas mixture that is passed through the reaction chamber would not have to contain a silicon compound. This compound, however, does not influence the deposition of arsenic. In this example a simpler deposition process has been chosen in which, after the first step, the supply of the arsenic compound only has to be stopped.

Figure 2:
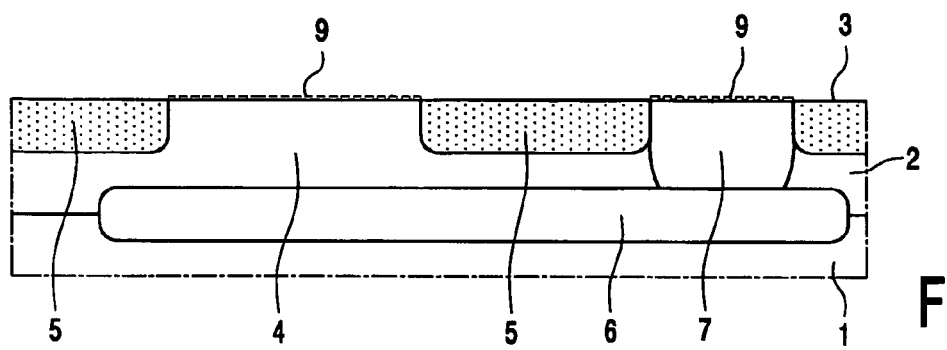

During the first step, a layer of arsenic forms on the monocrystalline silicon of the active region 4 and the contact region 7, as schematically indicated in FIG. 2 by means of dashed line 9, while no arsenic is deposited on the insulation regions of silicon oxide 5. This process stops automatically when a closed monoatomic layer of arsenic has formed in approximately 3 minutes on the active region 4 and the contact region 7. During the second step, the deposition of amorphous silicon on the insulation regions 5 starts immediately, while during a certain nucleation time of approximately 10 minutes, no deposition takes place on the arsenic-coated active regions 4 and 7. In this manner, the auxiliary layer 8 is formed only on the insulation regions 5 in a self-aligning manner.

Figure 3:
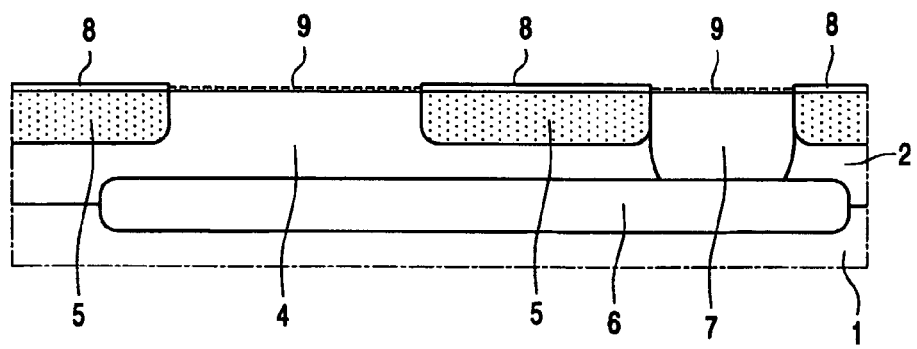

The second step is terminated prior to the deposition of silicon on the arsenic layer 9 formed on the active region 4 in the first step. The deposition process of the auxiliary layer is then stopped before the nucleation time has ended. After this nucleation time a layer of amorphous silicon starts forming also on the active regions. Within said ten minutes of nucleation time, as shown in FIG. 3, an approximately 10 nm thick auxiliary layer of amorphous silicon is formed on the insulation regions 5.

Figure 4:
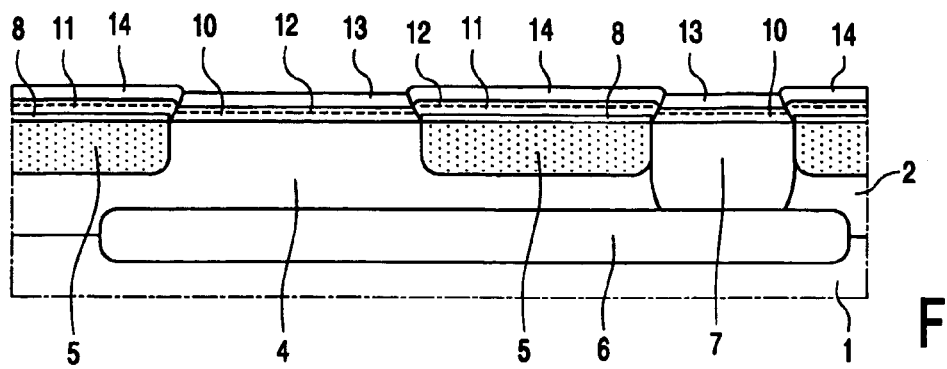

After the formation of the auxiliary layer 8, a silicon-containing double layer 10, 11 and 12, 13 is deposited, as shown in FIG. 4, in a customary manner at a temperature below 700° C. and a pressure below 50 Torr. In this example, first an approximately 35 nm thick layer 10, 11 of $Si_{1-x}Ge_x$, where $0.05<x<0.20$, to which less than 0.2 at. % carbon is added, is deposited. For this purpose, the silicon body is placed in a reaction chamber through which a gas mixture is passed comprising, in addition to a non-reactive carrier gas, silane, germanium and carbon dioxide. After some time, diborane is added to this gas mixture for a short period of time. A layer 10, 11 is thus deposited which, as indicated by means of a dashed line 12, is provided with an intermediate layer which is p-type doped with boron ions. A monocrystalline layer 10 is formed on the active region 4; a polycrystalline layer 11 is formed on the auxiliary layer 8 formed on the insulation regions 5. A monocrystalline layer 10 is formed also on the contact regions 7.

After the deposition of the layer 10, 11 of $Si_{1-x}Ge_x$, an approximately 30 nm thick layer 13, 14 of silicon is subsequently deposited in this example. For this purpose, a gas mixture comprising, in addition to a non-reactive carrier gas, silane is passed through the reaction chamber. On the monocrystalline layer 10 formed on the active regions 4, a monocrystalline layer of silicon 13 is formed, and on the polycrystalline layer 11 formed on the auxiliary layer 8, a polycrystalline layer of silicon 14 is formed. On the monocrystalline layer 10 formed on the contact regions 7, also a monocrystalline layer of silicon 13 is formed.

The growth on the active regions 4 and the insulation regions 5 starts at the same time. The monocrystalline layer 10 and non-monocrystalline layer 11 thus formed are deposited in a substantially equal thickness and thus blend seamlessly. Also the layers 13 and 14 formed thereon blend seamlessly.

Figure 5:
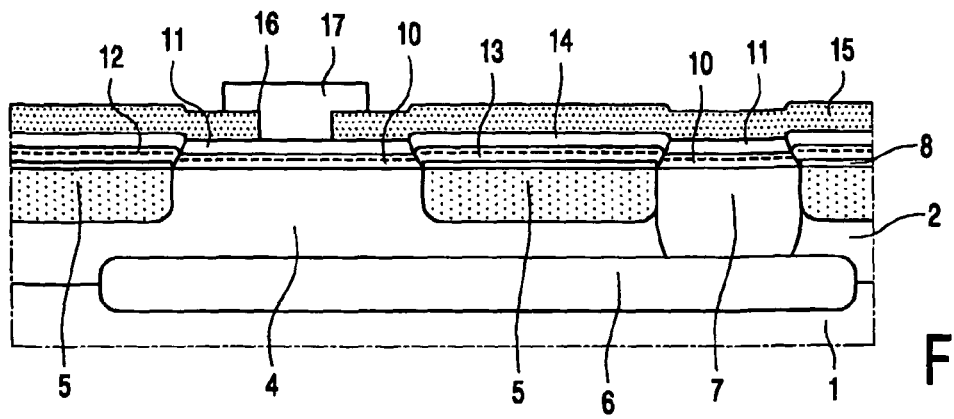
Figure 6:
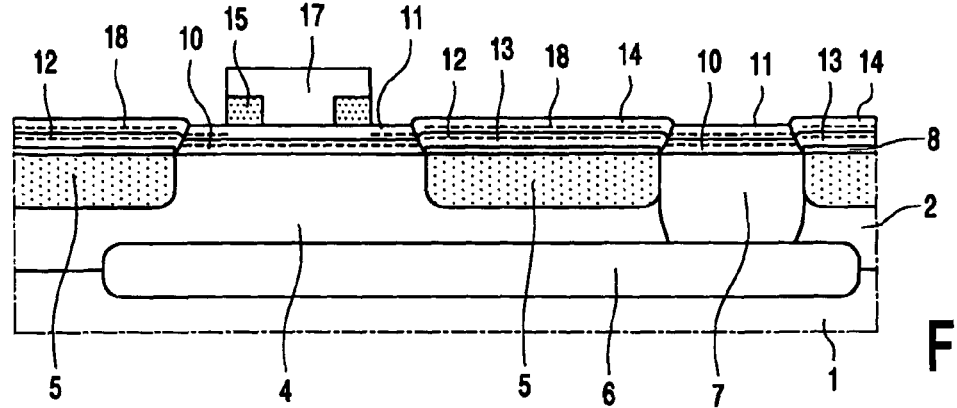

On the layers 10, 13, 11, 14 thus deposited, a layer of silicon oxide 15 is deposited, as shown in FIG. 5, wherein a window 16 is etched in a customary manner at the location of the active region 4, within which window the deposited layer of monocrystalline silicon 11 is exposed. On the layer of silicon oxide 15, a conductor track 17 of n-type doped polycrystalline silicon is subsequently provided, which contacts the layer 13 through the window 16. Next, as shown in FIG. 6, the insulating layer of silicon oxide 15 is etched away, using the conductor track 17 as a mask, and boron ions are implanted in the silicon layer 13, 14, as indicated by means of a dashed line 18, using the conductor track 17 as a mask.

Figure 7:
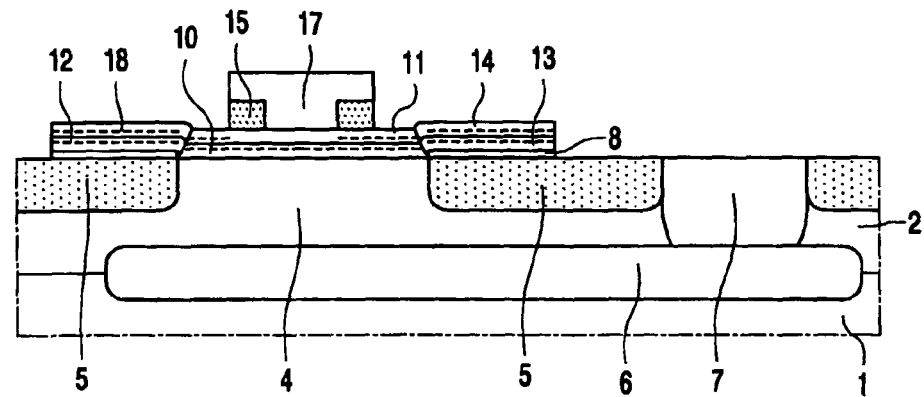

As shown in FIG. 7, the deposited layers 10, 11, 13, 14 are subsequently patterned in a customary manner. Above the active region 4 and above an edge of the insulating regions 5 bordering on said region, the layers 10, 11, 13, 14 are maintained, while they are removed from the surface 3 at locations next to said edge.

Figure 8:
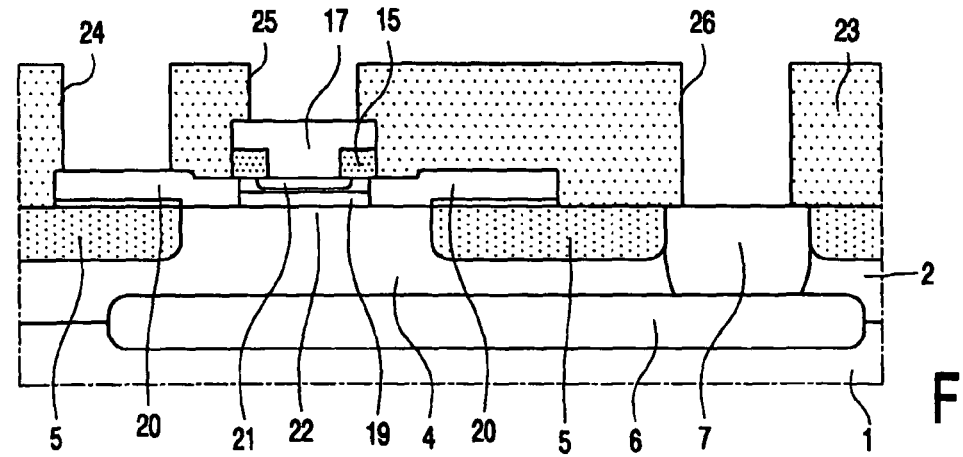

During a short thermal treatment of the slice, in this example the slice is heated at 900° C. for 30 seconds, a base zone 19 and a base connection 20, as shown in FIG. 8, are formed by diffusion of, respectively, the ions 12 and 18 provided in the layers 10, 11, 13, 14. By diffusion of doping atoms from the conductor track 17, an emitter zone 21 is formed in the layer of monocrystalline silicon 13. The part of the active region 4 situated just below the surface 3 forms the collector zone 22 of the transistor. The conductor track 17, the base connection zone 20 and the contact zone 7 are provided with a top layer of titanium disilicide, not shown, after which a relatively thick layer of silicon oxide 23 is deposited on the structure thus formed, as shown in FIG. 8, in which windows 24, 25 and 26 are subsequently formed for contacting, respectively, the base zone 19 (via the base connection zone 20), the emitter zone 21 and the collector zone 22 (via the buried layer 6 and the contact zone 7).

After the formation of the auxiliary layer 8, but before the deposition of the silicon-containing double layer 10, 11; 13, 14, the monoatomic layer of arsenic 9 can be removed. This does not take place in this example. The silicon-containing double layer 10, 11; 13, 14 is deposited on the monoatomic arsenic layer 9. As a result, the active region 4 bordering on the surface 3 and forming the collector zone 22 of the transistor obtains a comparatively high n-type doping. In absolute terms, the p-type base zone 19 is higher doped than the n-type collector zone 22. By virtue of the presence of the arsenic layer at the surface of the collector zone 22, it is achieved that the pn junction between collector and base will be situated in the base zone 19 formed in the silicon-germanium layer 10. Without said arsenic layer 9, this pn junction would be formed in the collector zone 22, resulting in the formation of a thicker base and hence a slower transistor.

The invention claimed is:

1. A method of manufacturing a semiconductor device on a region of silicon oxide situated next to a region of monocrystalline silicon at a surface of a semiconductor body, the method comprising the steps of:
   1) forming a layer of arsenic on the region of monocrystalline silicon by heating the silicon oxide and monocrystalline regions in an atmosphere with an arsenic compound, the layer of arsenic not being formed on the region of silicon oxide; and, thereafter,
   2) forming a layer of non-monocrystalline silicon as an auxiliary layer on the region of silicon oxide by heating the semiconductor body in an atmosphere that includes a gaseous silicon compound and that does not include a gaseous arsenic compound, the layer of non-monocrystalline silicon not being formed on the region of monocrystalline silicon;
   wherein the layer of arsenic is removed and then a silicon-containing layer is deposited on the region of monocrystalline silicon.

2. A method as claimed in claim 1, wherein the semiconductor body is heated during Step 1) in an atmosphere comprising, in addition to the gaseous arsenic compound, the gaseous silicon compound used during Step 2).

3. A method a claimed in claim 1, wherein Step 2) is ended before deposition from the silicon compound takes place on the arsenic layer formed on the region of monocrystalline silicon.

4. A method as claimed in claim 1, wherein during the forming of the auxiliary layer, the semiconductor body is heated at a temperature in the range between 400 and 600° C. in an atmosphere with a pressure below 500 mTorr.

5. A method as claimed in claim 1, further comprising, after the formation of the auxiliary layer, depositing a silicon-containing layer on the arsenic layer and on the auxiliary layer by heating the semiconductor body in an atmosphere that includes a gaseous silicon compound, thereby forming a monocrystalline layer on the region of monocrystalline silicon and forming a polycrystalline layer on the auxiliary layer.

6. A method as claimed in claim 5, wherein the silicon-containing layer is a layer of $Si_{1-x}Ge_x$, where $0.05<x<0.20$, and to which less than 0.2 at. % carbon is added, and wherein the semiconductor body is heated in an atmosphere comprising a silicon compound and a germanium compound.

7. A method as claimed in claim 5, further comprising forming an n-type collector zone of a bipolar transistor in the region of monocrystalline silicon, and forming a p-type base zone of the bipolar transistor in the first monocrystalline layer.

8. A method as claimed in claim 5, further comprising depositing a silicon layer on the arsenic layer and on the monocrystalline layer and on the polycrystalline layer by heating the semiconductor body in an atmosphere that includes a gaseous silicon compound, thereby forming a monocrystalline layer of silicon on the monocrystalline layer and forming a polycrystalline layer of silicon on the polycrystalline layer.

9. A method as claimed in claim 8, further comprising depositing a silicon oxide layer on the monocrystalline layer of silicon and on the polycrystalline layer of silicon, etching the silicon oxide layer to form a window that exposes part of the monocrystalline layer of silicon, and providing an n-type doped polycrystalline silicon conductor track that contacts the monocrystalline layer of silicon through the window.

10. A method of manufacturing a semiconductor device on a region of silicon oxide situated next to a region of monocrystalline silicon at a surface of a semiconductor body, the method comprising:

1) forming a layer of arsenic on the region of monocrystalline silicon by heating the silicon oxide and monocrystalline regions in an atmosphere with an arsenic compound, the layer of arsenic not being formed on the region of silicon oxide; and, thereafter, 2) forming a layer of non-monocrystalline silicon as an auxiliary layer on the region of silicon oxide by heating the semiconductor body in an atmosphere that includes a gaseous silicon compound and that does not include a gaseous arsenic compound, the layer of non-monocrystalline silicon not being formed on the region of monocrystalline silicon, wherein the semiconductor body further includes a buried layer and a contact zone that is situated next to the region of silicon oxide at the surface of the semiconductor body, the contact zone extending from the surface of the semiconductor body to the buried layer, and wherein the layer of arsenic is also formed on the contact zone during step 1) and the layer of non-monocrystalline silicon is not formed on the contact zone during step 2).

* * * * *